(12) United States Patent
Mok et al.

(10) Patent No.: US 7,293,906 B2
(45) Date of Patent: Nov. 13, 2007

(54) LIGHT SOURCE ADAPTED FOR LCD BACK-LIT DISPLAYS

(75) Inventors: Thye Linn Mok, Bukit Mertajam (MY); Siew Kim Tan, Alor Setar Kedah (MY)

(73) Assignee: Avago Technologies ECBU IP (Singapore) Pte Ltd, Singapore (SG)

( * ) Notice: Subject to any disclaimer, the term of this patent is extended or adjusted under 35 U.S.C. 154(b) by 180 days.

(21) Appl. No.: 11/136,170

(22) Filed: May 23, 2005

(65) Prior Publication Data

US 2006/0262554 A1 Nov. 23, 2006

(51) Int. Cl.
*F21V 7/04* (2006.01)
(52) U.S. Cl. ............... 362/609; 362/612; 362/631
(58) Field of Classification Search ........... 362/608, 362/609, 612, 613, 555, 294, 623–626, 630, 362/631, 615–622, 600–607, 27, 231
See application file for complete search history.

(56) References Cited

U.S. PATENT DOCUMENTS 6,386,720 B1 * 5/2002 Mochizuki ............... 362/27
2004/0066645 A1 * 4/2004 Graf et al. ............... 362/31
2004/0179348 A1 * 9/2004 Pesenti ................... 362/31
2005/0116235 A1 * 6/2005 Schultz et al. ........... 257/79
2005/0185421 A1 * 8/2005 Hayakawa ............... 362/612
2006/0002141 A1 * 1/2006 Ouderkirk et al. ......... 362/609
2006/0098453 A1 * 5/2006 Kuo ........................ 362/609
2006/0114693 A1 * 6/2006 Chou et al. ............... 362/631

* cited by examiner

*Primary Examiner*—Sandra O'Shea
*Assistant Examiner*—Bao Q. Truong

(57) ABSTRACT

An apparatus having a light source, a reflector, and a light pipe is disclosed. The light source includes a plurality of LED dies arranged in an array along a first direction, each LED die emitting light in a second direction. The light pipe includes a layer of transparent material having a top surface, a bottom surface, and an edge surface. The reflector reflects light from the LED dies traveling in the second direction into the edge surface of the light pipe such that a portion of the light is reflected by the top and bottom surfaces of the reflector. In one embodiment, the reflector redirects light leaving the LED dies within a predetermined cone of angles about the first direction into the light pipe such that the light in that predetermined cone of angles is totally reflected by the top surface of the light pipe.

18 Claims, 6 Drawing Sheets

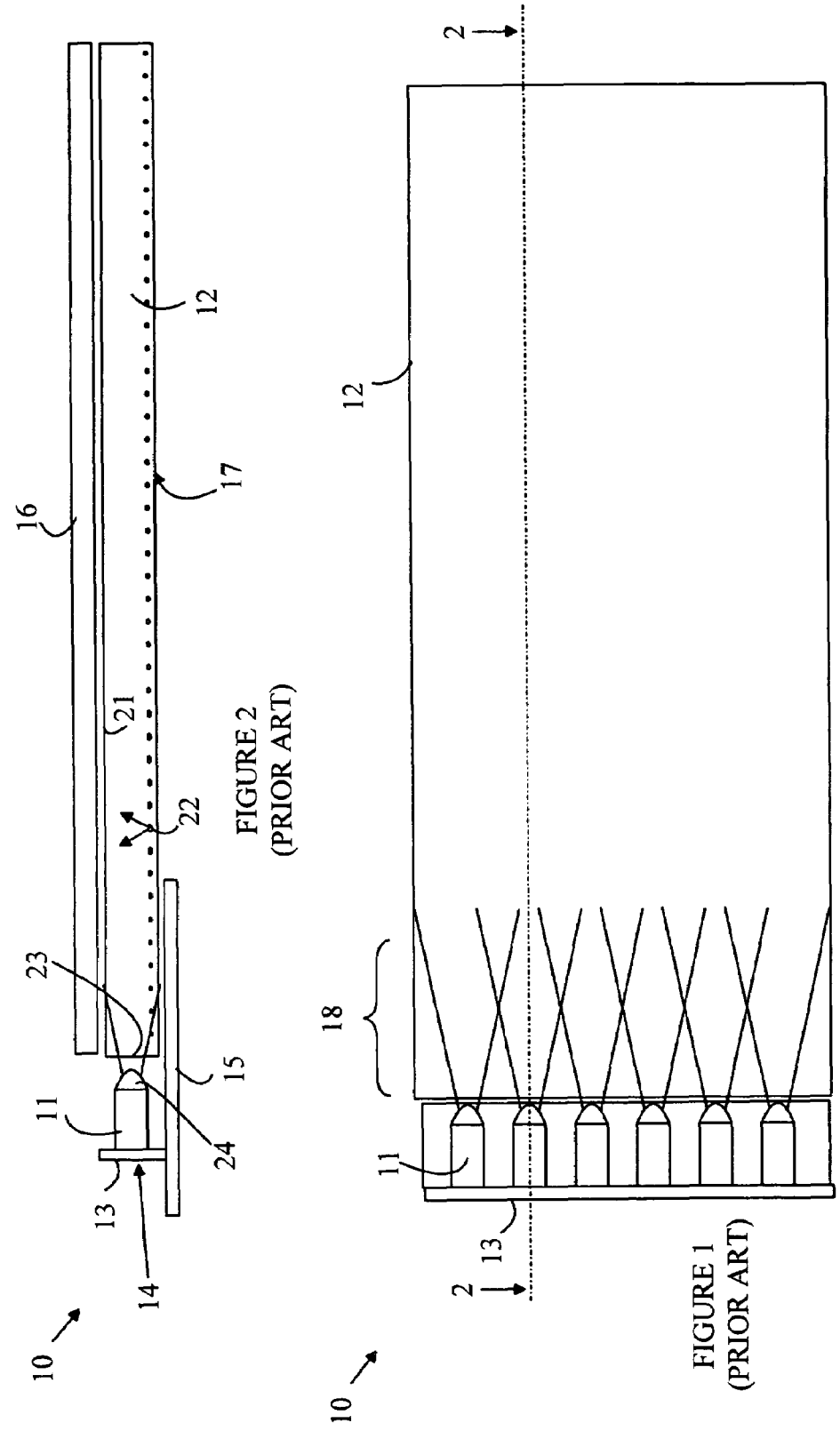

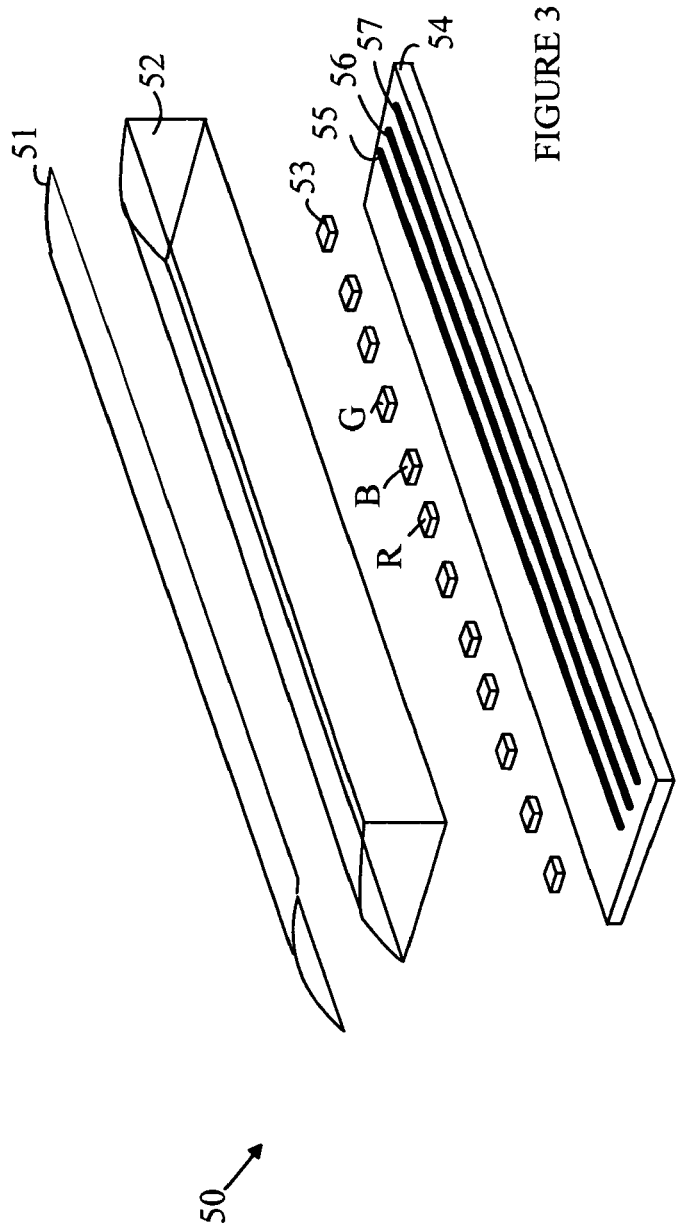
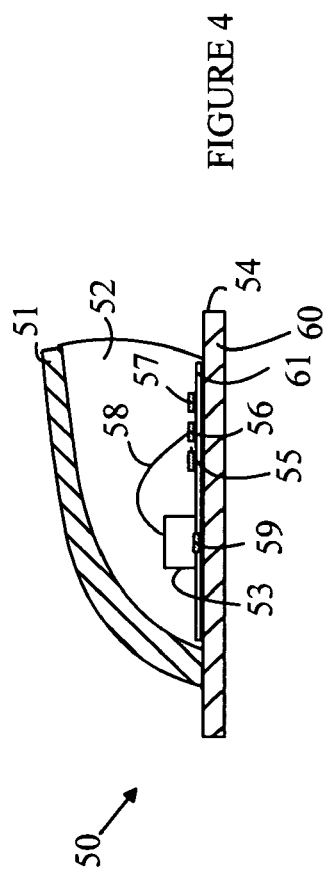

LIGHT SOURCE ADAPTED FOR LCD BACK-LIT DISPLAYS

BACKGROUND OF THE INVENTION

Liquid crystal displays (LCDs) are used in a wide variety of computers and consumer devices such as TVs. A back-lit LCD is an array of pixels in which each pixel acts as a shutter that either passes or blocks light from a light source that is located behind the pixel. Color displays are implemented by equipping the pixels with color filters such that each pixel transmits or blocks light of a particular color. The intensity of the light from each pixel is set by the time the pixel is in the transmissive state.

The display is typically illuminated by a white light source that provides a uniform intensity of light across the back surface of the display. Illumination sources based on fluorescent lights are particularly attractive because of their high light output per watt-hour of power consumed. However, such sources require high driving voltages which makes them less attractive for battery operated devices.

As a result, there has been considerable interest in utilizing light sources based on LEDs in such applications. LEDs have similar electrical efficiency and long lifetimes. In addition, the driving voltages needed are compatible with the battery power available on most portable devices.

The illumination system typically utilizes some form of light box or light pipe behind the LCD array. Light is injected into this light box at the periphery of the light box. The surface of the light box opposite to the surface that is adjacent to the LCD array has some form of scattering covering that scatters the light so that the back surface of the LCD is uniformly illuminated.

The thickness of the light source is limited by the thickness of the light box. The thickness of the display is particularly important in displays used for laptop computers and handheld devices such as PDAs and cellular telephones, as the display thickness limits the overall thickness of the device. Some of these portable devices require light boxes that are less than 10 mm thick. As the thickness of the light box is reduced, the efficient injection of light into the light box from the sides in a manner that assures uniform illumination becomes more difficult.

In addition, large displays present a power dissipation problem. Most of the power applied to the LEDs is converted to heat, rather than light. Since the light source is confined to the periphery of the light box, this heat is concentrated in the region around the periphery of the light box. Prior art LED-based light sources used to illuminate a light box do not provide an inexpensive method for moving the heat from the LEDs to a heat dissipating surface.

SUMMARY OF THE INVENTION

The present invention includes an apparatus having a light source, a reflector, and a light pipe. The light source includes a plurality of LED dies arranged in an array along a first direction, each LED die emitting light in a second direction. The light pipe includes a layer of transparent material having a top surface, a bottom surface, and an edge surface. The reflector reflects light from the LED dies traveling in the second direction into the edge surface of the light pipe such that a portion of the light is reflected by the top and bottom surfaces of the reflector. In one embodiment, the reflector redirects light leaving the LED dies within a predetermined cone of angles about the first direction into the light pipe such that the light in that predetermined cone of angles is totally reflected by the top surface of the light pipe. In one embodiment, the bottom surface of the layer of transparent material includes features that scatter light striking the features, at least some of the light is scattered toward the top surface at an angle such that the scattered light exits the top surface of the layer of transparent material. In one embodiment, the LED dies are bonded to a substrate having a metal core with an insulating layer bonded to one surface of the metal core. In one embodiment, the reflector includes a cylindrical reflector having an axis parallel to the first direction. In one embodiment, a transparent medium fills the volume between the reflector and the substrate such that the dies are covered by the transparent medium. In one embodiment, the substrate includes a reflective surface for reflecting light from the LED dies that strikes the surface. In one embodiment, light leaving the LED dies through the sides of those dies is reflected into the reflector.

BRIEF DESCRIPTION OF THE DRAWINGS

FIG. 1 is a top view of light source 10.

FIG. 2 is a cross-sectional view of light source 10 through line 2-2.

FIG. 3 is an exploded perspective view of light source 50.

FIG. 4 is a cross-sectional view of light source 50.

DETAILED DESCRIPTION OF THE PREFERRED EMBODIMENTS OF THE INVENTION

Figure 5:
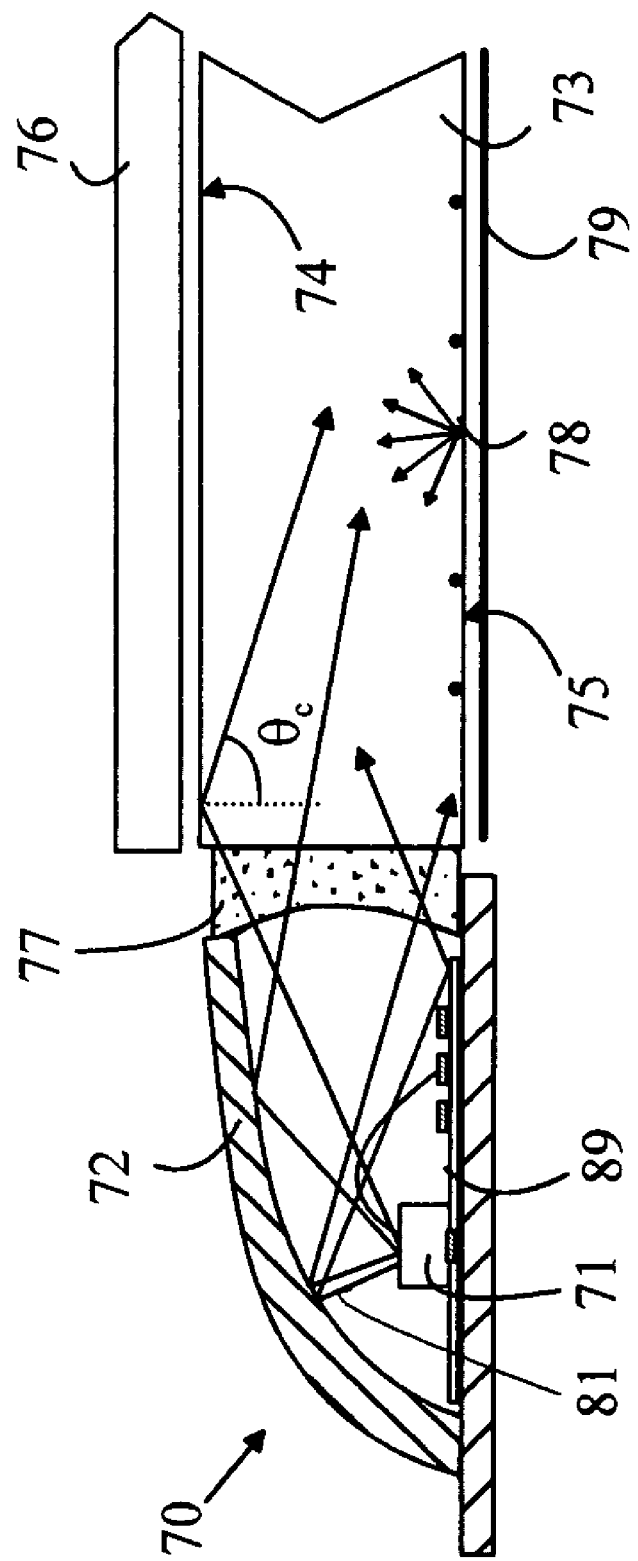
FIG. 5 is a cross-sectional view of a light source 70 attached to the edge of a light pipe 73.

The manner in which the present invention provides its advantages can be more easily understood with reference to FIGS. 1 and 2, which illustrate a prior art light box arrangement for illuminating an LCD display 16. FIG. 1 is a top view of light source 10 and FIG. 2 is a cross-sectional view of light source 10 through line 2-2. Light source 10 utilizes an array of LEDs 11 to illuminate a light pipe 12. The LEDs are mounted on a circuit board 13 that is mounted on a second board 15 that provides power to the LEDs. The LEDs are positioned such that light leaving the top of each LED illuminates the end of light pipe 12. The light entering light pipe 12 at an angle greater than the critical angle with respect to the normal of surface 21 is reflected back and forth within light pipe 12 until the light is either absorbed or scattered by particles 22 on surface 17. The scattered light that strikes surface 21 at angles less than the critical angle escapes from the light pipe and illuminates the back surface of LCD display 16.

The arrangement shown in FIGS. 1 and 2 has a number of problems. First, the mixing of the light from the LEDs is poor, particularly in the region 18 near the LEDs. This problem is made worse by the use of individual packaged LEDs, as the distance between light sources must be sufficiently large to accommodate the packaging of the individual LED chips. Hence, either the edge of LCD display 16 will either be poorly illuminated or the light pipe must be extended such that the area of non-uniform illumination is not under the LCD supply. The latter solution increases the size of the apparatus in which the display is being used, and hence, is undesirable.

Second, the heat generated by the LEDs must be dissipated either on the back surface 14 of printed circuit board 13 or by being conducted to printed circuit board 15. The area available for heat dissipation on surface 14 is limited by the height of printed circuit board 13. As the display thickness is reduced, this height must also be reduced. Alternatively, the heat can be conducted through printed circuit board 13 to printed circuit board 15 that has a larger area available for heat dissipation. However, the heat flow is restricted by the thickness of printed circuit board 13.

Third, a significant fraction of the light generated by the LEDs is lost at the air-light pipe interface due to reflections arising from the difference in index of refraction between the light pipe and the air. If the space between the LED lens 24 and the light pipe end 23 is filled with an index of refraction material, the imaging properties of the lens are lost, and hence, a significant fraction of the light generated by the LED will not be imaged into the narrow light pipe.

Refer now to FIGS. 3 and 4, which illustrate a light source according to one embodiment of the present invention. FIG. 3 is an exploded perspective view of light source 50, and FIG. 4 is a cross-sectional view of light source 50. Light source 50 may be viewed as a linear light source constructed from a plurality of LED dies 53. In the embodiment shown in FIG. 3, each LED emits either red, green, or blue light. The dies are alternated to provide an approximately uniform color along the length of the light source. In one embodiment, the relative light intensity emitted by the dies is adjusted to provide a white light source of a predetermined color temperature.

The LED dies are encapsulated in a clear medium 52 having an outer surface that includes a reflector 51. The encapsulation material protects the dies. In addition, the encapsulation material provides an index of refraction match to a light pipe that is part of an LCD illumination system as discussed below. The reflecting surface of reflector 51 is preferably cylindrical in shape with a hyperbolic cross-section. However, other cross-sections and shapes can be utilized.

The individual dies are mounted on a substrate 54 that includes a metal core 60 that acts as a heat sink and heat dissipation path. In addition, the metal core provides one of the power rails, preferably ground, for the LEDs. The top surface of substrate 54 includes an electrically insulating layer 61 on which various conducting traces are bonded. In the exemplary embodiment shown in FIGS. 3 and 4, three signal traces are utilized, one for each color of LED. The individual LEDs are connected to the appropriate signal trace by a wire bond such as wire bond 58 shown in FIG. 4. In the embodiment shown in these drawings, the common power rail is connected to a contact on the bottom of each die by a path 59 through insulating layer 61. However, the LED can be mounted directly on the metal core if the die does not have any other electrical contacts on the bottom surface of the die.

In the embodiment shown in FIGS. 3 and 4, all of the red-emitting LEDs are connected to a first signal trace 55, all of the blue-emitting LEDs are connected to a second signal trace 56, and all of the green-emitting LEDs are connected to a third signal trace 57. By varying the current provided on the traces or the duty cycle of the signal on the traces, the average intensity of light from the LEDs can be adjusted. Such an arrangement allows the output spectrum of the light source to be adjusted to a specified color and to be maintained at that color as the LEDs age. If a particular application requires each LED to be adjusted separately, a separate trace can be applied for each LED.

The manner in which the size and shape of the reflector are determined can be more easily understood with reference to FIG. 5, which is a cross-sectional view of a light source 70 attached to the edge of a light pipe 73 that forms a light mixing box for illuminating an LCD panel 76. Light source 70 is connected to light pipe 73 by a region 77 that is filled with an index matching compound. The light leaving LED 71 in the vertical direction is reflected by reflector 72 into light pipe 73. The size and cross-sectional shape of reflector 72 are chosen such that substantially all of the light leaving LED 71 that is initially reflected from the top surface 74 or bottom surface 75 of light pipe 73 is reflected at an angle greater than the critical angle $\theta_c$. Hence, that light will be totally internally reflected back toward the bottom surface 75 of light pipe 73. Upon striking surface 75, the light will either be reflected at an angle that is again greater than the critical angle or scattered by the scattering centers 78 on surface 75. The light that is reflected will once again be totally reflected by surface 74 and redirected back to surface 75. The light that is scattered such that the scattered light strikes surface 74 at an angle less than $\theta_c$ will exit the light pipe and illuminate the bottom surface of LCD panel 76. Any light that is scattered at angles greater than $\theta_c$ will remain trapped within the light pipe.

Some of the light scattered by scattering centers 78 will be directed away from surface 74 at angles that would allow the light to escape through surface 75. To prevent the loss of such light, the bottom surface of light pipe 73 can be coated with a reflecting material or a separate reflector 79 can be placed below light pipe 73.

The amount of light that reaches the light pipe can be further increased by utilizing a substrate with a reflective surface 89. Some of the light leaving die 71 will be reflected such that the light strikes the substrate as illustrated by the ray labeled 81. If the surface of the substrate is reflective, this light will be directed into the light pipe, thereby increasing the light collection efficiency.

It should be noted that LED dies emit a significant fraction of light out of the sides of the dies. This is light that is trapped inside the die by total internal reflection from the horizontal surfaces within the die. This light leaves the die at the sides where it strikes the surfaces at approximately right angles. The encapsulating material shown at 52 in FIG. 4 reduces this side emitted light, since it more nearly matches the index of refraction of the die material than a die-air interface. However, the die material still has a substantially greater index of refraction than the encapsulating material, and hence, a significant amount of light can still be directed out of the sides of the die.

Some conventionally packaged LEDs collect this light by placing the die in a dish-shaped reflector that reflects the side-emitted light into the forward direction. However, embodiments that include a separate reflector for each die are less than ideal for two reasons. First, the cost of providing such separate reflectors is substantial, and hence, the cost of the light source is increased. Second, a die arrangement that provides discrete point sources along a line results in less uniform illumination of the LCD surface than an arrangement that more nearly simulates a continuous light source along this line.

Figure 6:
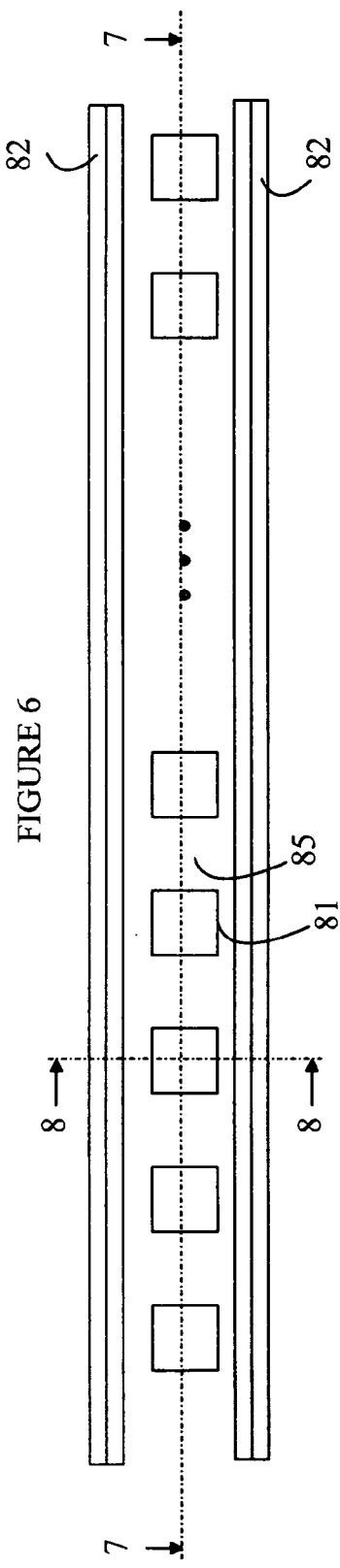
FIG. 6 is a top view of the die arrangement.
Figure 7:
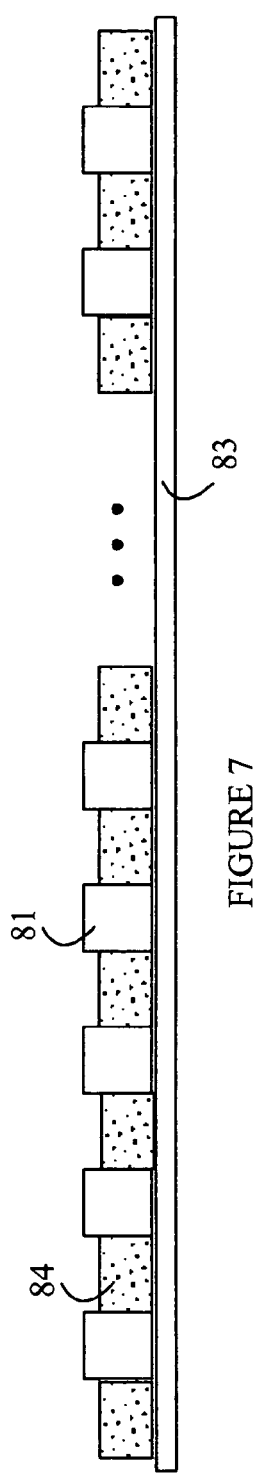
FIG. 7 is a cross-sectional view through line 7-7 shown in FIG. 6.
Figure 8:
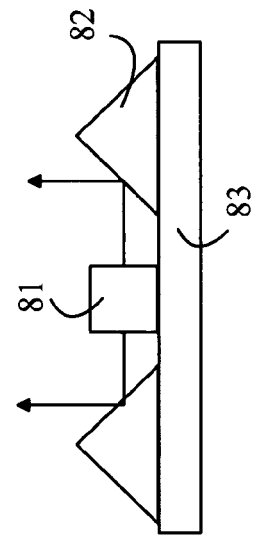
FIG. 8 is a cross-sectional view through line 8-8 shown in FIG. 6.

Refer now to FIGS. 6-8, which illustrate a die arrangement that more nearly approximates a continuous linear light source. FIG. 6 is a top view of the die arrangement; FIG. 7 is a cross-sectional view through line 7-7 shown in FIG. 6, and FIG. 8 is a cross-sectional view through line 8-8 shown in FIG. 6. The dies 81 are arranged along line 7-7 with a space 85 between each pair of dies. As noted above, the color emitted by the dies alternates such that no two adjacent dies emit the same color. Two linear reflectors shown at 82 are positioned to reflect light leaving the sides of the dies in a direction perpendicular to line 7-7. These reflectors reflect the light such that it is directed in the same direction as light leaving the top of the die. The spaces 85 between the dies is filled with a transparent material having scattering particles suspended therein as shown at 84. The surface of substrate 83 under these regions is reflective. Hence, light scattered downward by the particles is redirected in the forward direction, this particulate scattering medium redirects the side light to the forward direction and acts as a diffuser thereby blurring the discrete nature of the light source along line 7-7.

Figure 9:
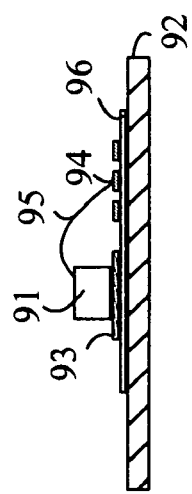
FIG. 9 is a cross-sectional view of a light source through a die.
Figure 10:
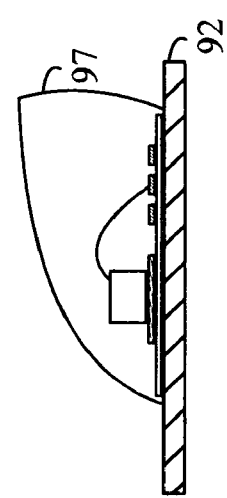
FIG. 10 illustrates a clear plastic layer molded over the mounted dies thereby encapsulating the dies and the various wire bonds.
Figure 11:
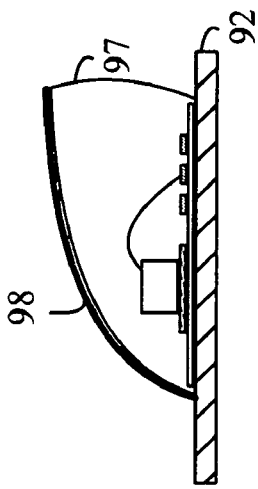
FIG. 11 illustrates a reflective layer deposited on the top surface of a clear plastic layer.

Refer now to FIGS. 9-11, which illustrate one method for fabricating a light source according to the present invention. Initially, the dies are mounted on a substrate 92 as shown in FIG. 9, which is a cross-sectional view of a light source through a die 91. Die 91 is mounted on an electrically conducting trace 93 that acts as the common ground connection for all of the dies. Die 91 is also connected to an electrical conductive signal trace 94 by a wire bond 95. The various electrical traces are bonded to an electrically insulating layer 96, which insulates the traces from substrate 92, which is preferably constructed from metal. In the embodiment shown in FIG. 9, it is assumed that layer 96 is thin, and hence, does not provide a significant impediment to the transfer of heat from die 91 to substrate 92. Alternatively, die 91 can be mounted directly on substrate 92. In this case, substrate 92 acts both as a heat transfer member and a common electrical connection. Next, a clear plastic or silicone layer 97 is molded over the mounted dies thereby encapsulating the dies and the various wire bonds as shown in FIG. 10. The top surface of the molded layer is shaped such that the surface will provide the correct curvature for the reflector described above. Finally, a reflective layer 98 is deposited on the top surface of layer 97 as shown in FIG. 11.

Figure 12:
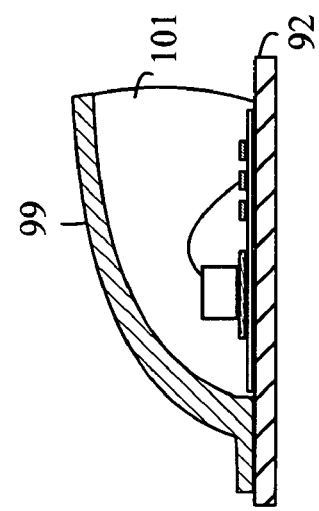
FIG. 12 illustrates a preformed reflector bonded to a substrate.
Figure 13:
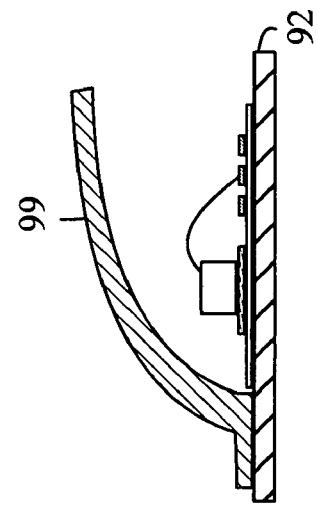
FIG. 13 illustrates the volume between the reflector and the substrate filled with a clear potting compound.

Refer now to FIGS. 12 and 13, which illustrate another method for fabricating a light source according to the present invention. In this method, the dies are mounted on the substrate as described above with reference to FIGS. 9-11. A preformed reflector 99 is bonded to substrate 92 as shown in FIG. 12. The volume between reflector 99 and substrate 92 is then filled with a clear potting compound 101 as shown in FIG. 13. This embodiment does not depend on the quality of the molded surface of layer 97 shown in FIG. 10, and hence, a more optically perfect reflecting surface can be provided. In addition, reflector 99 can provide an additional heat-radiating surface for moving heat from substrate 92 and the surrounding air.

The above-described embodiments utilize a connection scheme in which all of the LEDs of a particular color are connected in parallel to a common power terminal, and to a common ground used by all of the LEDs via a conductive pad under the LEDs. However, other arrangements can be utilized. For example, all of the LEDs of a particular color can be connected together in series. If the individual LEDs of a particular color require different voltages to provide the same light output, a series connection arrangement is preferred, as such an arrangement assures that all LEDs of a particular color are driven with the same current, and hence, will generate the same light output.

Figure 14:
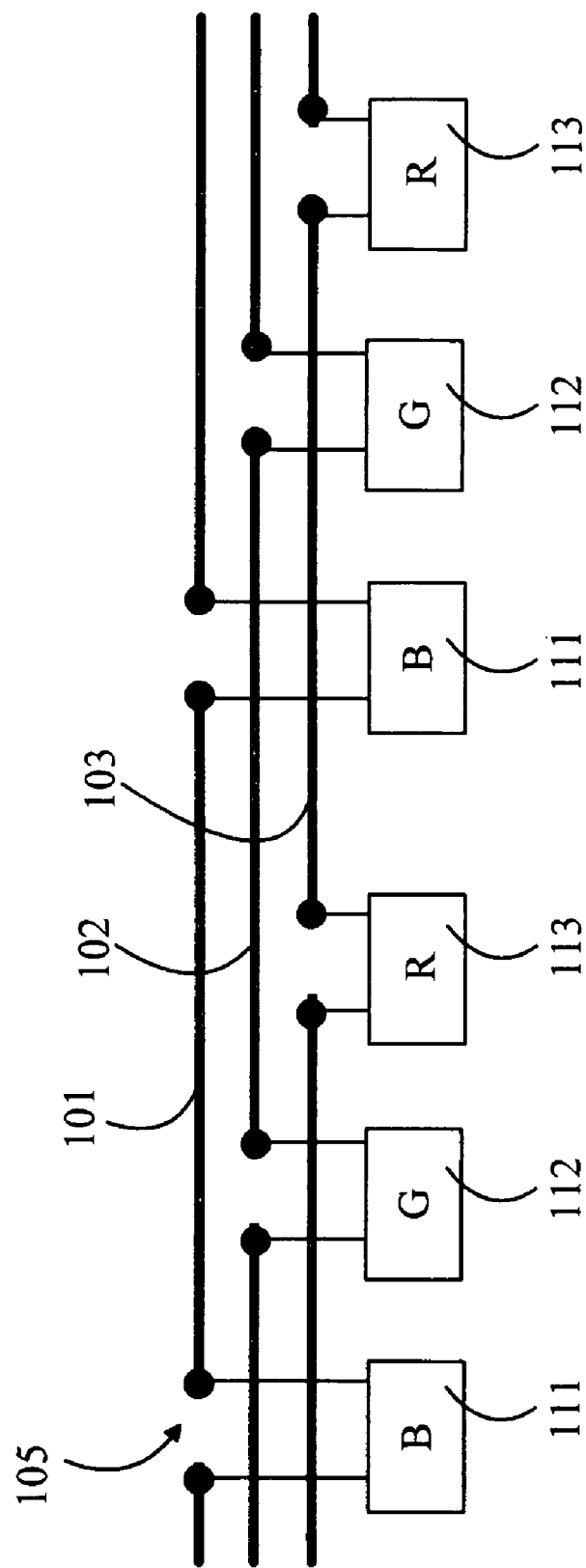
FIG. 14 illustrates a connection scheme in which the individual LEDs of each color are connected in series.

Refer now to FIG. 14, which illustrates a connection scheme in which the individual LEDs of each color are connected in series. In this arrangement, substrate 54 shown in FIG. 3 includes three metal traces 101-103 that include gaps such as gap 105 at each point at which an LED is to be connected. All of the blue LEDs 111 are connected to trace 101 such that the LED completes the circuit across one of the gaps in trace 101. Similarly, the green LEDs 112 are connected across the gaps in trace 102, and the red LEDs 113 are connected across the gaps in trace 103. The ends of each trace are connected to the drive circuits that power the LEDs of the corresponding color.

Various modifications to the present invention will become apparent to those skilled in the art from the foregoing description and accompanying drawings. Accordingly, the present invention is to be limited solely by the scope of the following claims.

What is claimed is:

1. An apparatus comprising:
   a light source comprising a plurality of LED dies arranged in an array along a first direction, each LED die emitting light in a second direction;
   a light pipe comprising a layer of transparent material having a top surface, a bottom surface, and an edge surface;
   a reflector that reflects light from said LED dies traveling in said second direction into said edge surface of said light pipe such that a portion of said light is reflected by said top and bottom surfaces of said light pipe;
   wherein said light leaves said LED dies within a predetermined cone of rays in which at least one ray is substantially perpendicular to said bottom surface and said ray is reflected into said light pipe by said reflector such that said light ray is totally reflected by said top surface of said light pipe.

2. An apparatus comprising:
   a light source comprising a plurality of LED dies arranged in an array along a first direction, each LED die emitting light in a second direction;
   a light pipe comprising a layer of transparent material having a top surface, a bottom surface, and an edge surface;
   a reflector that reflects light from said LED dies traveling in said second direction into said edge surface of said light pipe such that a portion of said light is reflected by said top and bottom surfaces of said light pipe;
   wherein said LED dies are bonded to a substrate;
   wherein said substrate further comprises a metal core with an insulating layer bonded to one surface of said metal core; and
   a transparent medium that fills a volume between said reflector and said substrate such that said dies are covered by said transparent medium.

3. The apparatus of claim 1 wherein said bottom surface of said layer of transparent material comprises features that scatter light striking said features, at least some of said light being scattered toward said top surface at an angle such that said scattered light exits said top surface of said layer of transparent material.

4. The apparatus of claim 1 wherein said LED dies are bonded to a substrate.

5. An apparatus comprising:
a light source comprising a plurality of LED dies arranged in an array along a first direction, each LED die emitting light in a second direction;
a light pipe comprising a layer of transparent material having a top surface, a bottom surface, and an edge surface;
a reflector that reflects light from said LED dies traveling in said second direction into said edge surface of said light pipe such that a portion of said light is reflected by said top and bottom surfaces of said light pipe;
wherein said LED dies are bonded to a substrate; and
wherein said substrate further comprises a metal core with an insulating layer bonded to one surface of said metal core.

6. The apparatus of claim 1 wherein said reflector comprises a cylindrical reflector having an axis parallel to said first direction.

7. The apparatus of claim 5 further comprising a plurality of electrically conductive traces on said insulating layer, each die being electrically connected to at least one of said electrically conductive traces.

8. The apparatus of claim 7 wherein said dies are connected to one of said traces such that said dies are connected in series.

9. The apparatus of claim 4 wherein said substrate comprises a reflective surface different from said reflector for reflecting light from said LED dies.

10. The apparatus of claim 1 wherein said LED dies comprise dies that emit light in different wavelength bands.

11. The apparatus of claim 10 wherein said LED dies that are adjacent to one another in said array emit light in different wavelength bands.

12. The apparatus of claim 1 wherein each LED die comprises a die top surface and a die side surface, said light emitted in said second direction leaving said die top surface and wherein said apparatus further comprises a side-light reflector for re-directing light emitted from said die side surface of one of said LED dies to a directional parallel to said second direction.

13. The apparatus of claim 12 wherein said side-light reflector comprises particles that scatter light suspended in a transparent medium that is located between said LED dies in said light array.

14. A method for illuminating a surface comprising:
providing a light source comprising a plurality of LED dies arranged in an array along a first direction, each LED die emitting light in a second direction;
providing a light pipe comprising a layer of transparent material having a top surface, a bottom surface, and an edge surface, said top surface being adjacent to said surface to be illuminated;
reflecting light from said LED dies traveling in said second direction into said edge surface of said light pipe such that a portion of said light is reflected by said top and bottom surfaces of said light pipe,
wherein said light leaves said LED dies within a predetermined cone of rays in which at least one ray is substantially perpendicular to said bottom surface and said ray is reflected into said light pipe by said reflector such that said light ray is totally reflected by said top surface of said light pipe.

15. The method of claim 14 further comprising scattering light from said bottom surface of said light pipe toward said top surface at an angle such that said scattered light exits said top surface of said layer of transparent material.

16. The method of claim 14 wherein said LED dies comprise dies that emit light in different wavelength bands.

17. The method of claim 16 wherein said dies that are adjacent to one another in said array emit light in different wavelength bands.

18. The method of claim 16 wherein light leaving said top surface of said light pipe layer is perceived as being white light by a person viewing that light.

* * * * *